(12) United States Patent
De Pauw

(10) Patent No.: US 7,759,155 B2
(45) Date of Patent: Jul. 20, 2010

(54) OPTICAL DATA TRANSCEIVERS

(75) Inventor: Piet De Pauw, Oudenaarde (BE)

(73) Assignee: Melexis NV, Microelectronic Integrated Systems, Ypres (BE)

(*) Notice: Subject to any disclaimer, the term of this patent is extended or adjusted under 35 U.S.C. 154(b) by 0 days.

(21) Appl. No.: 11/815,927

(22) PCT Filed: Feb. 7, 2006

(86) PCT No.: PCT/IB2006/000231

§ 371 (c)(1),
(2), (4) Date: Jul. 15, 2008

(87) PCT Pub. No.: WO2006/085189

PCT Pub. Date: Aug. 17, 2006

(65) Prior Publication Data

US 2009/0097858 A1    Apr. 16, 2009

(30) Foreign Application Priority Data

Feb. 9, 2005    (GB) .................................. 0502628.1

(51) Int. Cl.
*H01L 21/00* (2006.01)
(52) U.S. Cl. ..................... 438/64; 438/26; 438/112; 438/127
(58) Field of Classification Search .......... 438/25–27, 438/64–66, 108, 112, 124, 126, 127; 257/99, 257/100, 685, 723, 724
See application file for complete search history.

(56) References Cited

U.S. PATENT DOCUMENTS 4,894,707 A * 1/1990 Yamawaki et al. .......... 257/680
5,622,873 A * 4/1997 Kim et al. ..................... 438/65
6,522,015 B1 * 2/2003 Glenn et al. ................ 257/777

(Continued)

FOREIGN PATENT DOCUMENTS

WO    WO 00/75986 A    12/2000

OTHER PUBLICATIONS

PCT International Preliminary Report on Patentability.

*Primary Examiner*—Kevin M Picardat
(74) *Attorney, Agent, or Firm*—Townsend and Townsend and Crew LLP

(57) ABSTRACT

An optical data transceiver is manufactured by forming an integrated control circuit (101) on a suitable substrate, such as a silicon wafer, and then mounting said integrated circuit (101) onto the lead frame (102). Electrical connections may then be made between said integrated circuit (101) and said lead frame (102). The combined assembly comprising the integrated circuit (101) and lead frame (102) is then inserted into the cavity of a mold tool (not shown). A suitable molding compound is injected to encapsulate the combined assembly. The mold tool is provided with a projection (not shown) that is in contact with a portion of the surface of the integrated circuit (101) when the assembly is in the mold tool. As a result, the opening (106), exposing that portion of the surface of the integrated control circuit (101) that was in contact with the projection of the mold tool, is provided. The cavity of the mold tool is also adapted so as to form a rim (107) around the opening (106) during the encapsulation process. After the encapsulation process is complete, an optically active element (105) is then connected to the integrated circuit (101).

19 Claims, 1 Drawing Sheet

Figure 1:
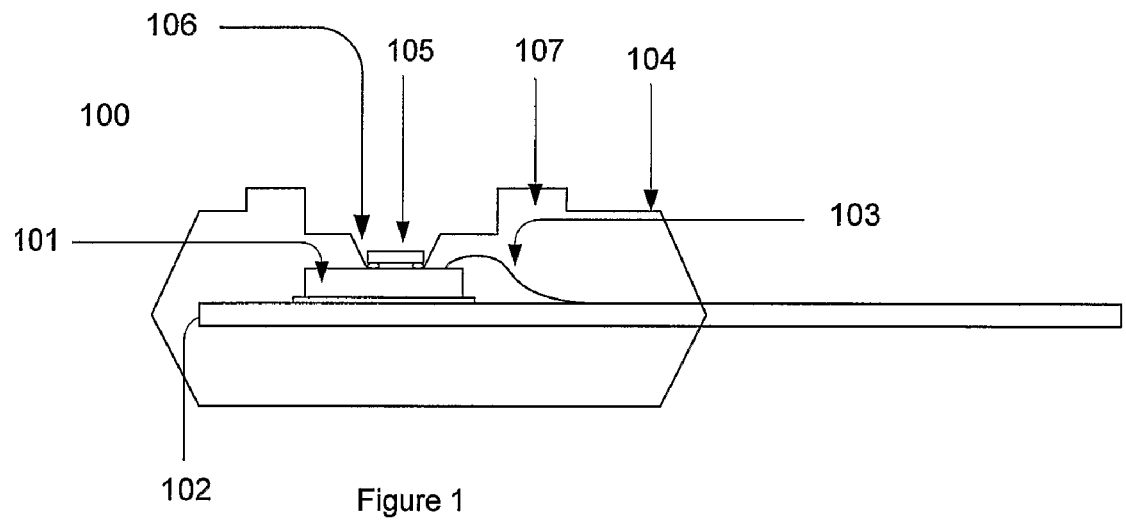

U.S. PATENT DOCUMENTS 6,893,169 B1 * 5/2005 Exposito et al. ............... 257/99
7,268,368 B1 * 9/2007 Knapp ......................... 257/80
7,468,556 B2 * 12/2008 Logan et al. ................ 257/723
2001/0014486 A1 8/2001 Glenn
2003/0214021 A1 11/2003 Zhou et al.

* cited by examiner

OPTICAL DATA TRANSCEIVERS

The present invention relates to optical data transmission systems and in particular to optical data transceivers and methods of manufacture thereof.

Optical data transmission systems use light to carry digital data along fibre optic cables. The light is generated by a first transceiver, coupled to the fibre, and travels along the fibre to its far end whereupon it is incident upon a second transceiver. The first transceiver acts to convert electrical signals into optical signals and the second transceiver acts to convert the optical signals back into electrical signals. This process may of course be reversed, with signals being sent from the second transceiver to the first transceiver, if desired.

Each transceiver has an optically active element or elements. Typically the optically active elements are a light emitting means and a light sensing means. It is however possible, if data transmission is required in a single direction only, that transceivers may be adapted only to emit light or to sense light i.e. to have a single optically active element being either a light emitting means or a light sensing means as appropriate. In this application, the term transceiver is used to encompass all three possibilities.

Conventionally, optical transceivers are provided in a protective package, said protective package having an aperture through which light may pass between the optically active elements of the transceiver and the exterior of the package and the aperture is adapted such that an optical fibre may be inserted and releaseably retained. If the optical fibre is not aligned correctly with the optically active elements, coupling between the optical fibre and the optical data transceiver is reduced and thus a proportion of the signal is lost. These losses reduce the effective intensity of the transmitted data signals and hence reduce the efficiency, the sensitivity, data rate, Bit Error Rate, and maximum communication range of the signal from their optimum values.

It is therefore an object of the present invention to provide a housing for optically coupling an optical data transmitter to an optical fibre.

According to a first aspect of the present invention there is provided a method of manufacturing a packaged optical data transceiver comprising the steps of: providing an integrated control circuit for an optically active element; inserting the integrated control circuit into a cavity of a moulding tool ensuring that at least a projection of the moulding tool is in contact with a portion of the surface of the integrated control circuit; introducing a plastic mould compound into the cavity so as to encapsulate, within a package, the integrated control circuit except for the portion in contact with the projection; removing the integrated control circuit from the cavity, whereby there is an opening defined in the package through which the portion of the surface of the integrated circuit in contact with the projection is exposed; and mounting an optically active element or elements on the exposed portion of the integrated circuit.

This thus provides a simple and effective method of manufacturing an optical data transceiver.

Preferably, the integrated circuit is mounted on a lead frame before encapsulation.

In one preferred embodiment, the optically active element is a light emitting means comprising a back emitting VCSEL (vertical cavity surface emitting laser) in flip chip format. In such embodiments the VCSEL may be mounted onto the exposed surface of the transmitter control integrated circuit using conventional flip chip techniques.

In an alternative preferred embodiment, the optically active element is a light emitting means comprising a front emitting VCSEL in wire bondable format. In such embodiments the VCSEL may be mounted onto the exposed surface of the transmitter control integrated circuit and is connected to connection pads using conventional wire bonding techniques.

The opening defined in the package is preferably shaped so as to receive and retain the end of an optical fibre in a desired position relative to the optically active element. This allows an optical fibre to be optically coupled with said optically active element or elements. The opening may be of circular cross-section, and may additionally comprise a raised rim. Additional means for retaining the optic fibre within the opening may also be provided. Preferably, the opening is formed in a desired shape as a result of adapting the shape of the projection of the mould tool.

The present invention may be adapted for use in any optical data transmission system or any optical data link. By embodying a light sensitive receiver into the transmitter control integrated circuit a bi-directional optical transceiver can be realised.

Preferably, the optical fibre is a plastic optic fibre (POF) or a polymer cladded silica fibre (PCS).

In one embodiment, the optical transceiver is an optical transceiver of the type comprising two optically active elements, a light emitting means and a light sensing means. In an alternative embodiment, the optical transceiver is an optical transceiver of the type comprising a single optically active element being a light emitting means.

In another embodiment, the optical transceiver comprises three optically active elements: a light emitting means operable to emit light in response to received electrical signals from said integrated control circuit; a first light sensing means operable to detect light emitted by the light emitting means and reflected from the end of an optical fibre optically coupled to said optical data transceiver, said first light sensing means being operable to output a signal indicative of the intensity of the reflected light to said integrated control circuit; and a second light sensing means operable to detect light incident upon said transceiver unit from an external source via said optical fibre and output electrical signals in response thereto, the integrated control circuit being operable to vary the intensity of the light emitted by the light emitting means in response to the output of the first light sensing means. In such an embodiment, means may be provided to prevent optical signals output by said transmitter unit being detected by said detector unit. Preferably said means is an interference coating provided on the surface of said optical detector, the thickness of said coating being such that it fully reflects incident light of the same wavelength as that emitted by the transmitter unit. Said interference coating may be comprised of any suitable material but is preferably Silicon Nitride.

According to a second aspect of the present invention there is provided an optical data transceiver manufactured in accordance with the method of the first aspect of the present invention.

Optical data transceivers may incorporate any or all of the features described in relation to the first aspect of the present invention as desired or appropriate.

According to a third aspect of the present invention there is provided an optical data transmission system comprising: a plurality of optical data transceivers in accordance with the second aspect of the present invention; and a plurality of optical fibres coupled to said plurality of optical data transceivers for carrying light signals between said plurality of transceivers.

One particular use of such an optical data transmission systems is in vehicular or automotive control.

In order that the present invention is clearly understood, two embodiments are now described, by way of example only, in greater detail below, with reference to the accompanying drawings, in which:—

Figure 2:
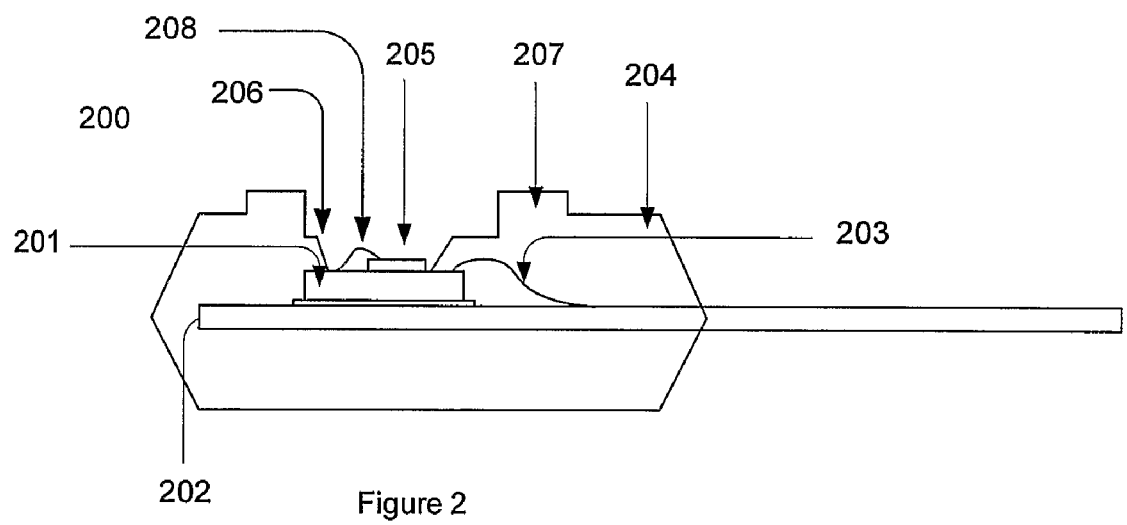

FIG. 1 is a sectional view of an optical data transceiver according to a first embodiment of the present invention; and FIG. 2 is a sectional view of an optical data transmitter according to a second embodiment of the present invention.

Referring now to FIG. 1, a packaged optical data transceiver 100 comprises an integrated control circuit 101 mounted on a lead frame 102, encapsulated within a plastic package 104. The package 104 has an opening 106 through which a portion of the integrated control circuit 101 is exposed. An optically active element 105 connected to the integrated control circuit 101 is mounted in the opening 106. The opening also is provided with a rim 107, which helps receive and retain an optical fibre, typically a POF or PCS optical fibre, within the opening 106 thus allowing the optical fibre to be optically coupled to the optically active element 105.

In the example of FIG. 1, the optically active element 105 is a bottom emitting VCSEL. The VCSEL 105 is mounted on and electrically connected to the integrated circuit 101 using flip chip techniques.

The optical data transceiver of FIG. 1 may be manufactured by forming the integrated control circuit 101 on a suitable substrate, such as a silicon wafer, and then mounting said integrated circuit 101 onto the lead frame 102. Electrical connections may then be made between said integrated circuit 101 and said lead frame 102. Typically, these electrical connections may be made via bond wires 103 as is shown in FIG. 1.

The combined assembly comprising the integrated circuit 101 and lead frame 102 is then inserted into the cavity of a mould tool (not shown). A suitable moulding compound injected to encapsulate the combined assembly. The mould tool is provided with a projection (not shown) that is in contact with a portion of the surface of the integrated circuit 101 when the assembly is in the mould tool. As a result, the opening 106, exposing that portion of the surface of the integrated control circuit 101 that was in contact with the projection of the mould tool, is provided. The cavity of the mould tool is also adapted so as to form the rim 107 around the opening 106 during the encapsulation process. After the encapsulation process is complete, the optically active element 105 is then connected to the integrated circuit 101.

Referring now to FIG. 2, an optical data transceiver 200, similar to that of FIG. 1 is shown. The optical data transceiver 200 comprises an integrated control circuit 201 mounted on a lead frame 202, encapsulated within a plastic package 204. The package 204 has an opening 206 through which a portion of the integrated control circuit 201 is exposed. An optically active element 205 connected to the integrated control circuit 201 is mounted in the opening 206. The opening also is provided with a rim 207, which helps receive and retain an optical fibre, typically a POF or PCS optical fibre, within the opening 206 thus allowing the optical fibre to be optically coupled to the optically active element 205.

In the example of FIG. 2, the optically active element 205 is a top emitting VCSEL. The VCSEL 205 is mounted on the integrated circuit 201 and is electrically connected to the integrated circuit 201 through wires 208, the wires 208 being connected to the VCSEL 205 and the integrated circuit 201 by any suitable wire bond technique.

The optical data transceiver of FIG. 1 may be manufactured by forming the integrated control circuit 201 on a suitable substrate, such as a silicon wafer, and then mounting said integrated circuit 201 onto the lead frame 202. Electrical connections may then be made between said integrated circuit 201 and said lead frame 202. Typically, these electrical connections may be made via bond wires 203 as is shown in FIG. 1.

The combined assembly comprising the integrated circuit 201 and lead frame 202 is then inserted into the cavity of a mould tool (not shown). A suitable moulding compound injected to encapsulate the combined assembly. The mould tool is provided with a projection (not shown) that is in contact with a portion of the surface of the integrated circuit 201 when the assembly is in the mould tool. As a result, the opening 206, exposing that portion of the surface of the integrated control circuit 201 that was in contact with the projection of the mould tool, is provided. The cavity of the mould tool is also adapted so as to form the rim 207 around the opening 206 during the encapsulation process. After the encapsulation process is complete, the optically active element 205 is then connected to the integrated circuit 201.

In both of the above embodiments, the optically active element is a single VCSEL however, in alternative embodiments, there may be more than one VCSEL. In other embodiments, the light emitting means may be provided alternatively by one or more LEDs or other suitable light emitting means. In further alternative embodiments, one or more light sensing means may be provided in addition to or as an alternative to the light emitting means. In alternative embodiments, wherein there is more than one optically active element, the optically active elements may each be mounted and connected to the integrated circuit separately or may alternatively be mounted together on a single substrate. Such additional or alternative optically active elements may be mounted on and connected to the integrated circuit by any suitable techniques, including those described above for mounting and connecting said VCSELs 105, 205 to the integrated circuit.

It is of course to be understood that the invention is not to be limited to the details of the above embodiments which is described by way of example only.

The invention claimed is:

1. A method of manufacturing a packaged optical data transceiver comprising the steps of:

providing an integrated control circuit for an optically active element;

mounting and electrically connecting the integrated control circuit to a lead frame to form an integrated control circuit and lead frame assembly;

inserting the integrated control circuit and lead frame assembly into a cavity of a moulding tool ensuring that at least a projection of the moulding tool is in contact with a portion of the surface of the integrated control circuit;

introducing a plastic mould compound into the cavity so as to encapsulate, within a package, the integrated control circuit and lead frame assembly except for the portion in contact with the projection;

removing the integrated control circuit and lead frame assembly from the cavity, whereby there is an opening defined in the package through which the portion of the surface of the integrated circuit in contact with the projection is exposed; and mounting and electrically connecting an optically active element or elements to the exposed portion of the integrated circuit.

2. A method as claimed in claim 1 wherein the optically active element comprises a light emitting means comprising a back emitting VCSEL in flip chip format.

3. A method as claimed in claim 2 wherein the VCSEL is mounted onto the exposed surface of the integrated control circuit using conventional flip chip techniques.

4. A method as claimed in claim 1 wherein the optically active element comprises a light emitting means comprising a front emitting VCSEL in wire bondable format.

5. A method as claimed in claim 4 wherein the VCSEL is mounted onto the exposed surface of the integrated control circuit and is connected to connection pads using conventional wire bonding techniques.

6. A method as claimed in claim 1 wherein the opening defined in the package is shaped so as to receive and retain the end of an optical fibre in a desired position relative to the optically active element or elements.

7. A method as claimed in claim 6 wherein the optical fibre is optically coupled with said optically active element or elements.

8. A method as claimed in claim 6 wherein the opening is of circular cross-section.

9. A method as claimed in claim 6 wherein the opening comprises a raised rim.

10. A method as claimed in claim 6 wherein additional means for retaining the optical fibre within the opening are provided.

11. A method as claimed in claim 6 wherein the optical fibre is a plastic optic fibre (POF) or a polymer cladded silica fibre (PCS).

12. A method as claimed in claim 6 wherein the opening is formed in a desired shape as a result of adapting the shape of the projection of the mould tool.

13. A method as claimed in claim 1 wherein the optically active element comprises both a light emitting means and a light sensing means.

14. A method as claimed in claim 1 wherein the optically active element comprises:

a light emitting means operable to emit light in response to received electrical signals from said integrated control circuit;

a first light sensing means operable to detect light emitted by the light emitting means and reflected from the end of an optical fibre optically coupled to said optical data transceiver, said first light sensing means being operable to output a signal indicative of the intensity of the reflected light to said integrated control circuit; and a second light sensing means operable to detect light incident upon said transceiver unit from an external source via said optical fibre and output electrical signals in response thereto, the integrated control circuit being operable to vary the intensity of the light emitted by the light emitting means in response to the output of the first light sensing means.

15. A method as claimed in claim 14 wherein an interference coating is provided to prevent optical signals output by said light emitting means being detected by said first light sensing means.

16. A method as claimed in claim 15 wherein said interference coating comprises a layer of Silicon Nitride.

17. An optical data transceiver manufactured in accordance with the method of claim 1.

18. An optical data transmission system comprising:
a plurality of optical data transceivers according to claim 17; and
a plurality of optical fibres coupled to said plurality of optical data transceivers for carrying light signals between said plurality of transceivers.

19. A system as claimed in claim 18 used in vehicular or automotive control.

\* \* \* \* \*